(12) United States Patent
Oh et al.

(10) Patent No.: US 12,100,886 B2
(45) Date of Patent: Sep. 24, 2024

(54) CONDUCTIVE PATTERN, ANTENNA DEVICE INCLUDING THE SAME, AND IMAGE DISPLAY DEVICE INCLUDING THE SAME

(71) Applicant: DONGWOO FINE-CHEM CO., LTD., Jeollabuk-do (KR)

(72) Inventors: Yun Seok Oh, Gyeonggi-do (KR); Young Gu Kang, Gyeonggi-do (KR); Jin Young Park, Gyeonggi-do (KR); Min Seok Jang, Gyeonggi-do (KR); Euk Kun Yoon, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 167 days.

(21) Appl. No.: 18/081,799

(22) Filed: Dec. 15, 2022

(65) Prior Publication Data
US 2023/0187814 A1   Jun. 15, 2023

(30) Foreign Application Priority Data

Dec. 15, 2021   (KR) .................. 10-2021-0179551

(51) Int. Cl.
*H01Q 1/22*   (2006.01)
*H01L 23/66*   (2006.01)
*H01Q 1/38*   (2006.01)

(52) U.S. Cl.
CPC .......... *H01Q 1/2283* (2013.01); *H01L 23/66* (2013.01); *H01Q 1/38* (2013.01); *H01L 2223/6677* (2013.01)

(58) Field of Classification Search
None
See application file for complete search history.

(56) References Cited

U.S. PATENT DOCUMENTS

| | | | |
|---|---|---|---|
| 2012/0212372 A1* | 8/2012 | Petersson | H01Q 21/08 343/893 |
| 2019/0288381 A1* | 9/2019 | Misaki | H01Q 21/0012 |
| 2020/0411990 A1* | 12/2020 | Nakamura | H01Q 21/06 |
| 2023/0276647 A1* | 8/2023 | Kawano | H10K 85/657 257/40 |
| 2023/0312458 A1* | 10/2023 | Haruyama | C09K 11/06 257/40 |

FOREIGN PATENT DOCUMENTS

| | | |
|---|---|---|
| KR | 10-2003-0095557 A | 12/2003 |
| KR | 10-2013-0095451 A | 8/2013 |

* cited by examiner

*Primary Examiner* — Wilson Lee
(74) *Attorney, Agent, or Firm* — The PL Law Group, PLLC

(57) ABSTRACT

A conductive pattern according to an embodiment includes a metal pattern and a blackened pattern which covers the metal pattern, wherein at least one of the metal pattern and the blackened pattern has a reverse taper shape. Thereby, it is possible to prevent the conductive pattern from being viewed by a user and improve image quality.

19 Claims, 10 Drawing Sheets

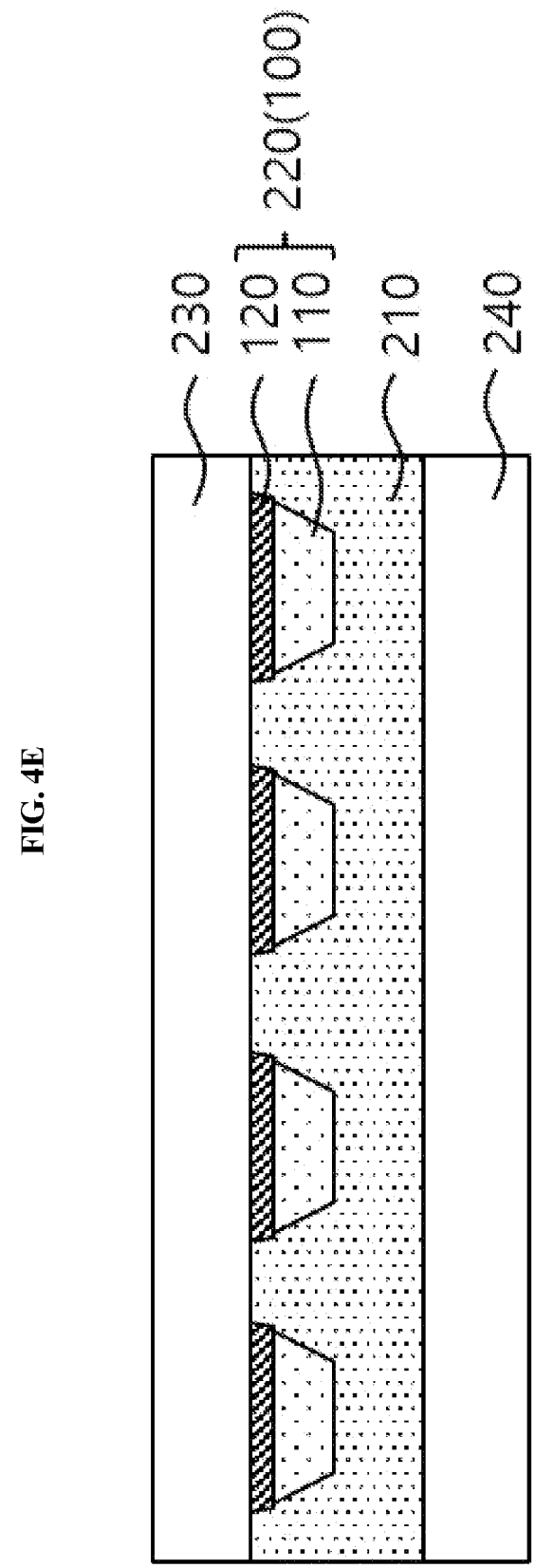

CONDUCTIVE PATTERN, ANTENNA DEVICE INCLUDING THE SAME, AND IMAGE DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2021-0179551, filed on Dec. 15, 2021, in the Korean Intellectual Property Office (KIPO), the entire disclosures of which are incorporated by reference herein.

BACKGROUND

1. Field

The present invention relates to a conductive pattern, an antenna device including the conductive pattern, and an image display device including the antenna device.

2. Background of the Related Art

Recently, according to development of the information-oriented society, wireless communication techniques such as Wi-Fi, Bluetooth, and the like are implemented, for example, in a form of smartphones by combining with image display devices. In this case, an antenna may be coupled to the image display device to perform a communication function.

Recently, with mobile communication techniques becoming more advanced, an antenna for performing communication, for example, in a high frequency or ultra high frequency band is necessary to be coupled to the image display device.

In particular, as the size of the display device is decreased, the antenna may be disposed in a display region of the display device, and in this case, a conductive pattern included in the antenna may be viewed by a user, thereby causing a deterioration in image quality of the display device.

Accordingly, it is necessary to design a conductive pattern and an antenna device capable of preventing them from being viewed by a user while maintaining or improving radiation characteristics of the antenna.

For example, Korean Patent Laid-Open Publication No. 2003-0095557 discloses an antenna structure buried in a portable terminal, but does not consider a material with improved visibility as described above.

SUMMARY

According to an aspect of the present invention, there is provided a conductive pattern with reduced visibility.

According to an aspect of the present invention, there is provided an antenna device including the conductive pattern with reduced visibility.

According to an aspect of the present invention, there is provided an image display device which includes the antenna device including the conductive pattern with reduced visibility. The above aspects of the present invention will be achieved by one or more of the following features or constructions:

1. A conductive pattern including: a metal pattern having an upper surface and a lower surface; and a blackened pattern which covers the upper surface of the metal pattern, the blackened pattern having an upper surface and a lower surface, wherein at least one of the metal pattern and the blackened pattern has a reverse taper shape, and the upper surface of the blackened pattern is formed to face a direction opposite to the lower surface of the metal pattern.
2. The conductive pattern according to the above 1, wherein a ratio of an area of the blackened pattern to an area of the metal pattern at a contact surface between the metal pattern and the blackened pattern is 100% to 160%.
3. The conductive pattern according to the above 1, wherein upper and side surfaces of the metal pattern form a first reverse taper angle, and upper and side surfaces of the blackened pattern form a second reverse taper angle; and each of the first reverse taper angle and the second reverse taper angle is 40 to 90°.
4. The conductive pattern according to the above 1, further including a transparent conductive oxide pattern disposed on a lower surface of the metal pattern.
5. The conductive pattern according to the above 1, wherein the blackened pattern has a thickness of 60 to 120 nm.
6. An antenna device including: a passivation layer; an antenna unit which is at least partially buried in an upper portion of the passivation layer and includes the conductive pattern according to the above 1; and a first insulation layer laminated on an upper surface of the passivation layer to cover the antenna unit.
7. The antenna device according to the above 6, wherein the antenna unit is spaced apart from a lower surface of the passivation layer in a thickness direction.
8. The antenna device according to the above 6, wherein the upper surface of the passivation layer and an upper surface of the antenna unit are disposed on the same plane.
9. The antenna device according to the above 6, wherein the antenna unit includes a radiator, a transmission line extending from the radiator, and a signal pad connected to a distal end of the transmission line, and the radiator includes the conductive pattern.
10. The antenna device according to the above 9, wherein the transmission line and the signal pad include the conductive pattern.
11. An image display device including: a display panel; and the above-described antenna device disposed on the display panel.
12. The image display device according to the above 11, wherein the antenna device is laminated on the display panel so that a lower surface of the passivation layer faces the display panel.
13. The image display device according to the above 11, further including an optical layer disposed between the antenna device and the display panel.
14. A method of manufacturing an antenna device, including: sequentially forming a separation layer, a first insulation layer, a blackened layer and a metal layer on a carrier substrate; patterning the blackened layer and the metal layer to form an antenna unit which includes a conductive pattern including the blackened pattern and the metal pattern; forming a passivation layer on the first insulation layer so that the antenna unit is at least partially buried therein; and laminating a laminate including the first insulation layer, the antenna unit and the passivation layer on a second insulation layer to bring a surface of the passivation layer into contact with an upper surface of the second insulation layer.

15. The method of manufacturing an antenna device according to the above 14, wherein the passivation layer, the metal pattern and the blackened pattern are sequentially disposed from the upper surface of the second insulation layer, and at least one of the blackened pattern and the metal pattern has a reverse taper shape.
16. The method of manufacturing an antenna device according to the above 14, further including peeling off the carrier substrate and the separation layer from the first insulation layer after the forming the passivation layer.
17. The method of manufacturing an antenna device according to the above 14, further including peeling off the carrier substrate from the separation layer after the forming the passivation layer, wherein the laminate further includes the separation layer.
18. The method of manufacturing an antenna device according to the above 14, wherein the antenna unit includes a radiator, a transmission line extending from the radiator, and a signal pad connected to a distal end of the transmission line, and the passivation layer is formed to cover the radiator and at least partially expose the signal pad.
19. The method of manufacturing an antenna device according to the above 18, further including electrically connecting a circuit board to the signal pad before the step of laminating the laminate on the second insulation layer.

According to exemplary embodiments, the conductive pattern may include a metal pattern and a blackened pattern for covering the metal pattern. In this case, the blackened pattern whose upper surface is provided as a visible surface covers the metal pattern, such that light reflection of the metal pattern may be suppressed. Accordingly, it is possible to prevent an antenna device to be described below from being viewed by a user.

In exemplary embodiments, at least one of the metal pattern and the blackened pattern may have a reverse taper shape. In this case, it is possible to remarkably suppress the metal pattern from being viewed by the user. Accordingly, it is possible to suppress the antenna unit including the conductive pattern from being viewed, and improve image quality of the image display device.

In some embodiments, a ratio of an area of the blackened pattern to an area of the metal pattern on the contact surface between the metal pattern and the blackened pattern may be 100 to 160%. In this case, the blackened pattern may be stably laminated on the metal pattern while the metal pattern is completely covered by the blackened pattern. Thereby, it is possible to prevent the conductive pattern from being viewed by the user and improve structural stability of the conductive pattern.

BRIEF DESCRIPTION OF THE DRAWINGS

FIGS. 4A to 4E are schematic cross-sectional views illustrating a method of manufacturing the antenna device according to exemplary embodiments.

DETAILED DESCRIPTION OF THE EMBODIMENTS

Figure 1:
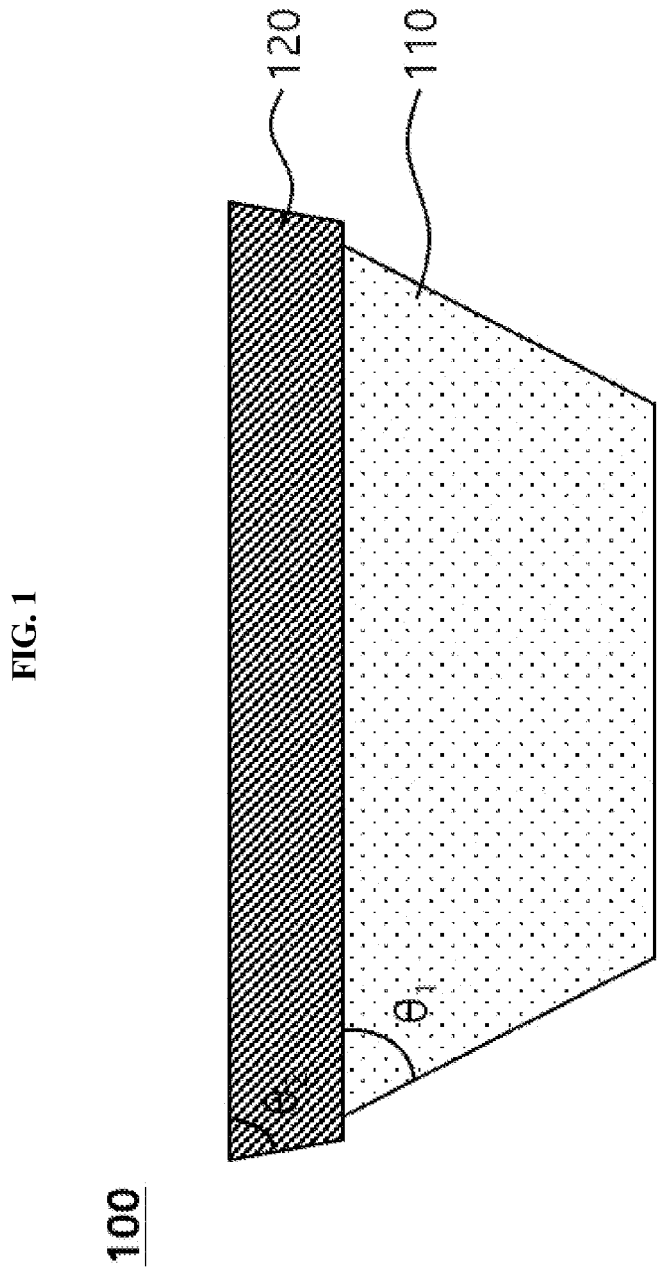
FIG. 1 is a schematic cross-sectional view illustrating a conductive pattern according to exemplary embodiments.

Embodiments of the present invention provide a conductive pattern having a multilayer structure and an antenna device including the conductive pattern. Further, embodiments of the present invention provide a method of manufacturing the antenna device and an image display device including the antenna device.

Hereinafter, preferred embodiments of the present invention will be described in detail with reference to the accompanying drawings. However, since the drawings attached to the present disclosure are only given for illustrating one of several preferred embodiments of present invention to easily understand the technical spirit of the present invention with the above-described invention, it should not be construed as limited to such a description illustrated in the drawings.

The terms "upper surface" and "lower surface" as used herein do not designate absolute positions, but are used to divide different components or to distinguish relative positions between the components.

FIG. 1 is a schematic cross-sectional view illustrating a conductive pattern according to exemplary embodiments.

Referring to FIG. 1, a conductive pattern 100 according to exemplary embodiments has a visible surface and a device surface, and may include a metal pattern 110 and a blackened pattern 120 which covers the metal pattern 110. In this case, the blackened pattern 120 may cover the metal pattern 110 in a planar direction, thus to suppress light reflection of the metal pattern 110. Accordingly, it is possible to prevent the conductive pattern 100 and the antenna unit to be described below from being viewed by a user.

The term "visible surface" as used herein may refer to a surface directly viewed by the user of an electronic device into which the conductive pattern 100 is inserted or a surface close to a visible side of the user.

The term "device surface" as used herein may refer to a surface facing the electronic device into which the conductive pattern 100 is inserted or a surface far from the visible side of the user.

In exemplary embodiments, an upper surface of the blackened pattern 120 may correspond to the visible surface and a lower surface of the metal pattern 110 may correspond to the device surface.

The metal pattern 110 may include metal such as silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca), or an alloy including at least one thereof. These may be used alone or in combination of two or more thereof.

In one embodiment, the metal pattern 110 may include silver (Ag) or a silver alloy (e.g., silver-palladium-copper (APC) alloy), or copper (Cu) or a copper alloy (e.g., a copper-calcium (CuCa) alloy) to implement a low resistance and fine line width pattern.

For example, the blackened pattern 120 may be disposed on an upper surface of the metal pattern 110 (e.g., the visible side of the user) to reduce reflectance on the surface of the conductive pattern 100. Accordingly, visibility of the conductive pattern 100 due to light reflection may be reduced.

The blackened pattern 120 may be formed by, for example, converting the above-described metals or alloy into a metal oxide or metal sulfide. In one embodiment, the blackened pattern 120 such as a black material coating layer or a plating layer may be formed on the metal pattern 110. The black material coating layer or plating layer may include silicon, carbon, copper, molybdenum, tin, chromium, nickel, cobalt, or oxide, sulfide, or an alloy containing at least one thereof.

The composition and thickness of the blackened pattern 120 may be adjusted in consideration of an effect of reducing reflectance, and radiation characteristics of the antenna to be described below.

In some embodiments, the blackened pattern 120 may have a thickness of 60 to 120 nm. In this case, an entire thickness of the conductive pattern 100 may be maintained thin while sufficiently suppressing visibility of the conductive pattern 100.

In exemplary embodiments, at least one of the metal pattern 110 and the blackened pattern 120 may have a reverse taper shape. In this case, it is possible to remarkably suppress the metal pattern 110 from being viewed by the user. Thereby, it is possible to suppress the antenna unit including the conductive pattern 100 from being viewed, and improve image quality of an image display device described below.

The term "reverse taper shape" as used herein may refer to a trapezoidal shape whose width is decreased toward the lower surface from the upper surface as shown in FIG. 1.

For example, an angle formed by the upper and side surfaces of the metal pattern 110 may be defined as a first reverse taper angle θ1. In addition, an angle formed by the upper and side surfaces of the blackened pattern 120 may be defined as a second reverse taper angle θ2.

In some embodiments, the first reverse taper angle θ1 and the second reverse taper angle θ2 may be 40 to 90°. In this case, the metal pattern 110 may be sufficiently covered by the blackened pattern 120 in the planar direction. Thereby, it is possible to further suppress the conductive pattern 100 from being viewed by the user.

In one embodiment, the first reverse taper angle θ1 may be smaller than the second reverse taper angle θ2. In this case, it is possible to further prevent the side surface of the metal pattern 110 from being viewed by the user.

In one embodiment, the second reverse taper angle θ2 may be smaller than the first reverse taper angle θ1. In this case, the upper surface of the blackened pattern 120 is relatively widened, such that the metal pattern 110 may be formed relatively thick. Accordingly, it is possible to implement the conductive pattern 100 having sufficient conductivity while suppressing the metal pattern 110 from being viewed.

In one embodiment, one of the metal pattern 110 and the blackened pattern 120 may have a rectangular shape (e.g., the reverse taper angles θ1 and θ2 are 90°), and the other one may have a reverse taper shape (e.g., the reverse taper angles θ1 and θ2 are less than 90°).

In some embodiments, a ratio of an area of the blackened pattern 120 to an area of the metal pattern 110 at a contact surface between the metal pattern 110 and the blackened pattern 120 may be 100 to 160%, and preferably 100 to 140%. In this case, the blackened pattern 120 may be stably laminated on the metal pattern 110 while the metal pattern 110 is completely covered by the blackened pattern 120. Thereby, it is possible to prevent the conductive pattern 100 from being viewed by the user and improve structural stability of the conductive pattern 100.

In some embodiments, a transparent conductive oxide pattern may be further formed on the lower surface of the metal pattern 110. In this case, signal transmission efficiency due to flexible properties and low resistance may be improved by the metal pattern 110, and corrosion resistance and transparency may be improved by the transparent conductive oxide pattern.

The transparent conductive oxide pattern may include at least one of indium tin oxide (ITO), indium zinc oxide (IZO), indium zinc tin oxide (IZTO) and zinc oxide (ZnOx).

Figure 2:
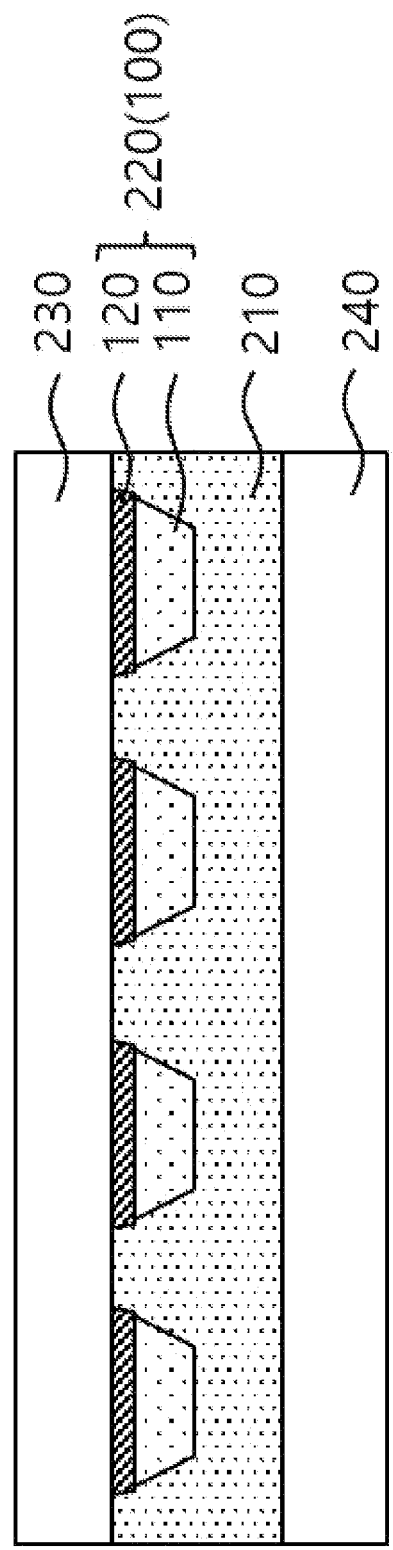
FIG. 2 is a schematic cross-sectional view illustrating an antenna device according to exemplary embodiments.

FIG. 2 is a schematic cross-sectional view illustrating an antenna device according to exemplary embodiments. Specifically, FIG. 2 is a cross-sectional view of the antenna device according to exemplary embodiments taken in a thickness direction.

Referring to FIG. 2, the antenna device 200 according to exemplary embodiments may include a passivation layer 210, an antenna unit 220 at least partially buried in an upper portion of the passivation layer 210, and a first insulation layer 230 laminated on an upper surface of the passivation layer 210 to cover the antenna unit 220.

For example, the antenna unit 220 may include the above-described conductive pattern 100 having the reverse taper angle shape. For example, as a material for the antenna unit 220, the above-described material for the conductive pattern 100 may be used. Accordingly, light reflection of the metal pattern 110 may be suppressed by the blackened pattern 120, thereby preventing the antenna unit 220 from being viewed by the user.

For example, the passivation layer 210 may be provided as an insulation layer for electrically separating the antenna unit 220 from other materials.

The passivation layer 210 may include, for example, an organic insulation material such as an epoxy resin, an acrylic resin, a siloxane resin or a polyimide resin, etc., or an inorganic insulation material such as a silicon oxide or silicon nitride, etc.

For example, the first insulation layer 230 may be positioned on the visible side of the user and provided as a substrate layer of the antenna unit 220. In this case, a separate substrate for the antenna unit 220 may not be inserted. Accordingly, the thickness and/or volume of the antenna device may be reduced.

The first insulation layer 230 may include, for example, a polyester resin such as polyethylene terephthalate, polyethylene isophthalate, polyethylene naphthalate, polybutylene terephthalate, etc.; a cellulose resin such as diacetyl cellulose, triacetyl cellulose, etc.; a polycarbonate resin; an acrylic resin such as polymethyl (meth)acrylate, polyethyl (meth)acrylate, etc.; a styrene resin such as polystyrene, acrylonitrile-styrene copolymer, etc.; a polyolefin resin such as polyethylene, polypropylene, cyclic polyolefin or polyolefin having a norbornene structure, ethylene-propylene copolymer, etc.; a vinyl chloride resin; an amide resin such as nylon, aromatic polyamide; an imide resin; a polyether sulfonic resin; a sulfonic resin; a polyether ether ketone resin; a polyphenylene sulfide resin; a vinylalcohol resin; a vinylidene chloride resin; a vinylbutyral resin; an allylate resin; a polyoxymethylene resin; an epoxy resin; a urethane or acrylic urethane resin; a silicone resin and the like. These may be used alone or in combination of two or more thereof.

The first insulation layer 230 may include an adhesive material such as an optically clear adhesive (OCA), an optically clear resin (OCR) and the like. In some embodiments, the first insulation layer 230 may include an inorganic insulation material such as a silicon oxide, silicon nitride, silicon oxynitride, glass and the like.

In some embodiments, a dielectric constant of the first insulation layer 230 may be adjusted in a range of about 1.5 to 12. If the dielectric constant exceeds about 12, a driving frequency is excessively reduced, such that driving of the antenna in a desired high frequency band may not be implemented.

For example, the first insulation layer 230 may be provided as a protective layer capable of protecting the antenna unit 220 from an external impact in a lamination process of an antenna device 200 to be described below. In this case, the first insulation layer 230 may include a material selected from materials capable of functioning as the protective layer, and may include, for example, the above-described organic and/or inorganic insulation materials.

In some embodiments, the antenna unit 220 may be disposed with being spaced apart from a lower surface of the passivation layer 210 in a thickness direction. Accordingly, driving reliability may be improved by preventing signals from being excessively absorbed by the conductive member or a ground layer of the image display device.

In some embodiments, the upper surface of the passivation layer 210 and an upper surface of the antenna unit 220 may be disposed on the same plane. For example, the upper surface of the passivation layer 210 and the upper surface of the antenna unit 220 may come into contact with a lower surface of the first insulation layer 230. Accordingly, at least a portion of the antenna unit 220 is substantially covered by the passivation layer 210, such that the above-described driving reliability and insulation effect may be sufficiently implemented.

Figure 3:
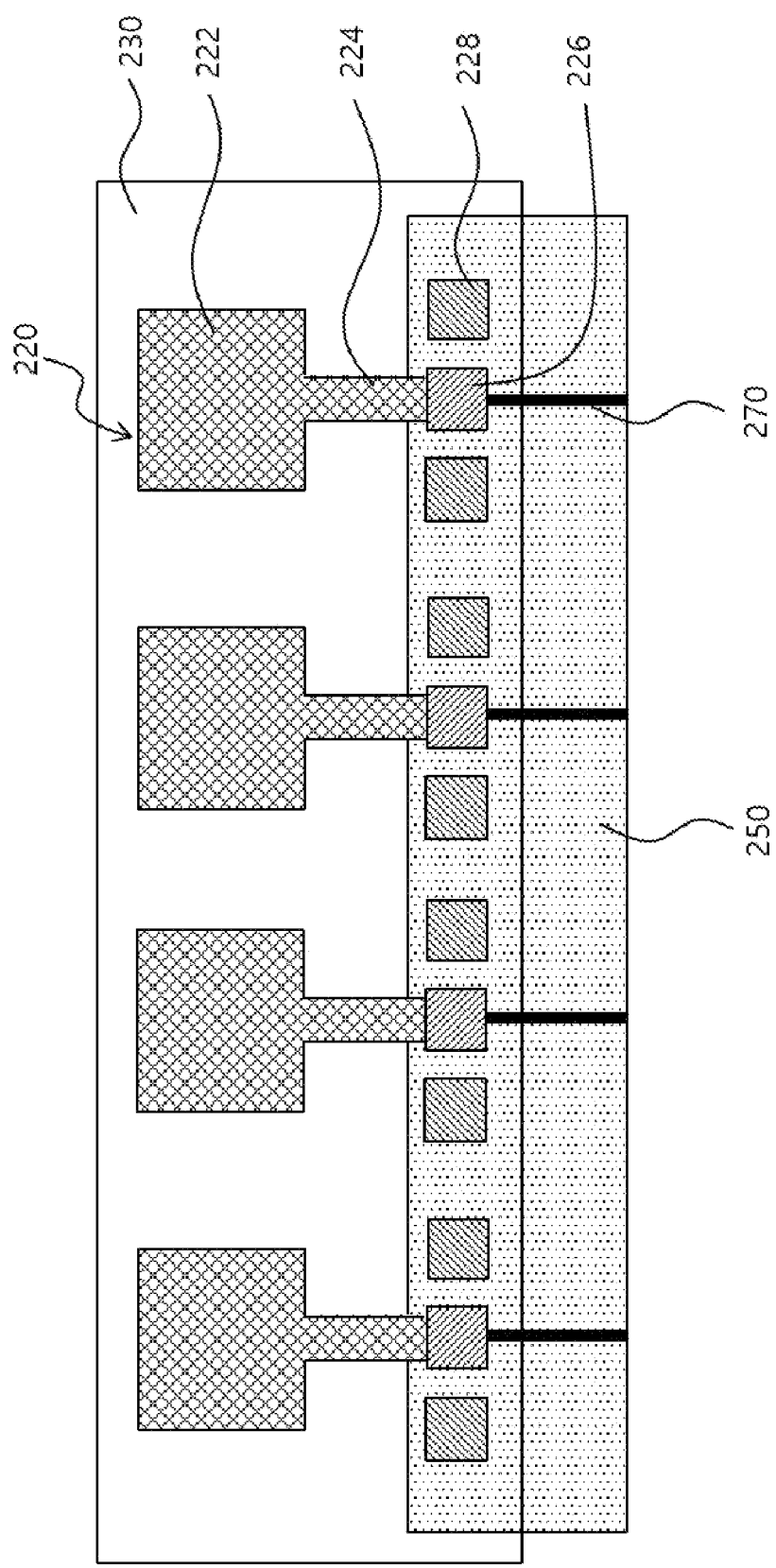
FIG. 3 is a schematic plan view illustrating the antenna device according to exemplary embodiments.

FIG. 3 is a schematic plan view illustrating the antenna device according to exemplary embodiments. Specifically, FIG. 3 is a plan view of the antenna device according to exemplary embodiments viewed in the planar direction.

Referring to FIG. 3, the antenna unit 220 may include a radiator 222, a transmission line 224 extending from the radiator 222, and a signal pad 226 connected to a distal end of the transmission line 224.

The radiator 222 may have, for example, a polygonal plate shape, and the transmission line 224 may extend from one side of the radiator 222. The transmission line 224 may be integrally formed with the radiator 222 as a substantial single member, and may have a narrower width than the radiator 222.

The signal pad 226 may be connected to the distal end of the transmission line 224. In one embodiment, the signal pad 226 is provided substantially as a member integrally formed with the transmission line 224, and the distal end of the transmission line 224 may be provided as the signal pad 226.

According to some embodiments, a ground pad 228 may be disposed around the signal pad 226. For example, a pair of ground pads 228 may be disposed facing each other with the signal pad 226 interposed therebetween. The ground pads 228 may be electrically and physically separated from the transmission line 224 and the signal pad 226.

The antenna unit 220 or the radiator 222 may be designed to have a resonance frequency, for example, in a high frequency or ultra high frequency band of 3G, 4G, 5G or higher. For example, the resonance frequency of the antenna unit 220 or the radiator 222 may be in a range of about 20 to 45 GHz.

The radiator 222 may include, for example, the above-described conductive pattern 100. For example, as a material for the radiator 222, the above-described material for the conductive pattern 100 may be used. In this case, it is possible to reduce the radiator 222 positioned in a display region of the image display device to be described below from being viewed by the user. In some embodiments, the radiator 222, the transmission line 224 and the signal pad 226 may be formed using substantially the same material and method as each other.

For example, as a material for each of the radiator 222, the transmission line 224 and the signal pad 226, the above-described material for the conductive pattern 100 may be used. In this case, the process may be simplified to enhance economic advantages.

In some embodiments, the radiator 222 and the transmission line 224 may include a mesh-pattern structure to improve the transmittance. In this case, a dummy mesh pattern (not shown) may be formed around the radiator 222 and the transmission line 224.

For example, the mesh-pattern structure may be formed by intersecting individual electrode lines, and each of the individual electrode lines may include the above-described conductive pattern 100.

The signal pad 226 and the ground pad 228 may be formed in a solid structure made of the above-described metals or alloy in consideration of a reduction in power supply resistance, and improvement in noise absorption efficiency and horizontal radiation characteristics.

In one embodiment, the radiator 222 may have a mesh-pattern structure, and at least a portion of the transmission line 224 may include a solid metal pattern.

In some embodiments, the passivation layer 210 may cover the radiator 222 with an upper surface of the signal pad 226 being at least partially exposed. In this case, a circuit board 250 including a circuit wiring 270 may be bond to the exposed signal pad 226 to be electrically connected thereto.

For example, the circuit wiring 270 may be bonded to the signal pad 226.

The circuit board 250 may include, for example, a flexible printed circuit board (FPCB).

For example, the circuit board 250 may extend to be electrically connected to a main board of the image display device. In this case, the antenna unit 220 and an antenna driving integrated circuit (IC) chip mounted on the main board may be electrically connected with each other through the circuit wiring 270. Accordingly, power supply/control signals (e.g., phase, beam tilting signals, etc.) may be applied from the antenna driving IC chip to the antenna unit 220.

For example, the antenna unit 220 may include a plurality of antenna units 220, and the plurality of antenna units 220 may be buried in the passivation layer 210 with being physically and electrically spaced apart from each other. In this case, the plurality of antenna units 220 may be disposed in the same manner as in the case of including a separate antenna base layer. Accordingly, the antenna device 200 having a relatively thin thickness may be formed while maintaining radiation performance and antenna gain characteristics of the antenna unit 220.

In some embodiments, a second insulation layer 240 may be disposed on the lower surface of the passivation layer 210. For example, the circuit board 250 may be disposed between the second insulation layer 240 and the antenna unit 220. For example, the image display device to be described below and the antenna device 200 may be coupled with each other through the second insulation layer 240.

Hereinafter, a method of manufacturing the antenna device 200 according to exemplary embodiments will be provided.

FIGS. 4A to 4E are schematic cross-sectional views illustrating the method of manufacturing the antenna device according to exemplary embodiments.

Figure 4A:
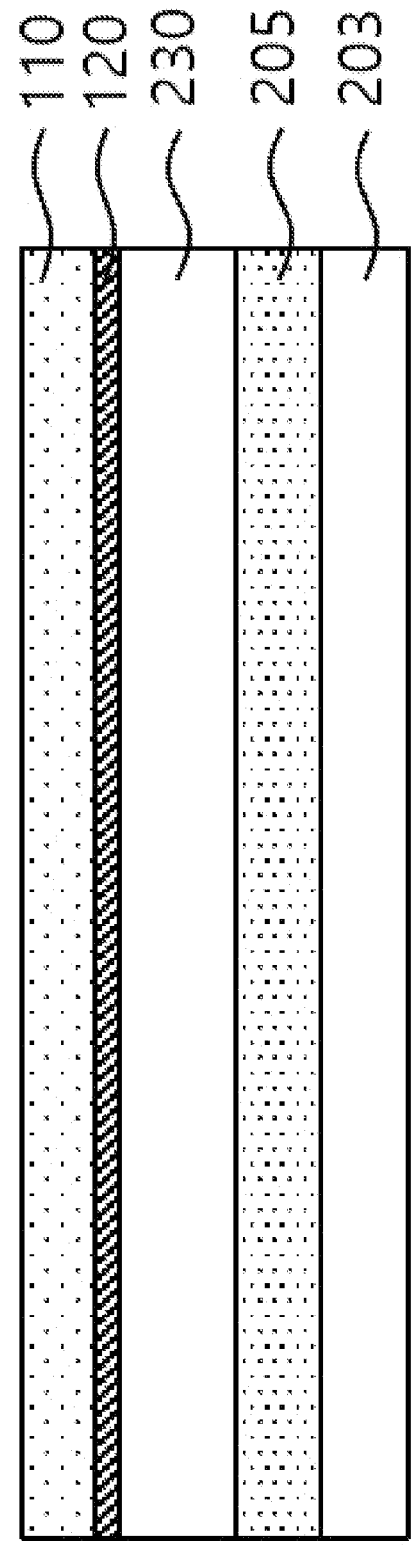

Referring to FIG. 4A section, a separation layer 205 and a first insulation layer 230 may be sequentially formed on a carrier substrate 203.

The carrier substrate 203 may include, for example, an inorganic insulation material such as glass.

The separation layer 205 may include a material selected from among easily attachable/peelable materials, and may include, for example, the above-described organic insulation material.

For example, a blackened layer 120 and a metal layer 110 may be sequentially formed on the first insulation layer 230.

Figure 4B:
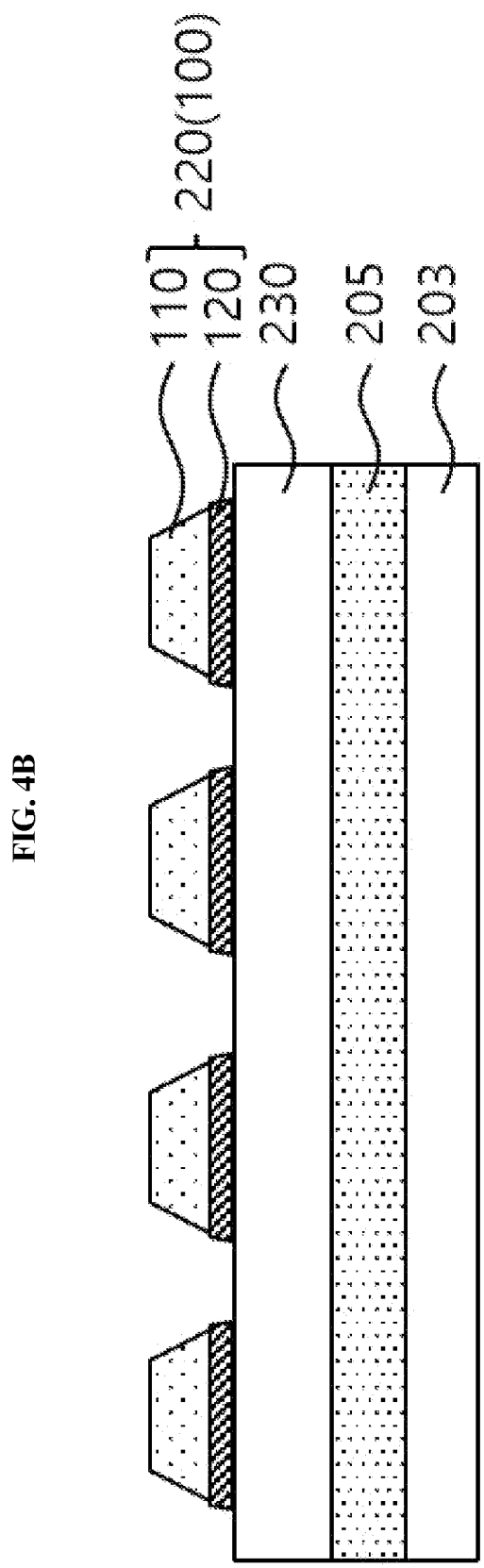

Referring to FIG. 4B section, the antenna unit 220 which includes the conductive pattern 100 including the blackened pattern 120 and the metal pattern 110 may be formed by patterning the blackened layer 120 and the metal layer 110.

The patterning used in the art may be used without limitation thereof. For example, the blackened layer 120 and the metal layer 110 may be patterned through a photolithography process.

For example, the blackened pattern 120 and the metal pattern 110, on which the patterning has been performed, may have a regular taper shape. In this case, the conductive pattern 100 and/or the antenna unit 220 may be turned upside down through a transfer process to be described below to have a reverse taper shape. Accordingly, the conductive pattern 100 and the antenna device 200 having the above-described effect of reducing visibility may be formed.

The term "regular taper shape" as used herein may refer to a trapezoid shape whose width is increased toward the lower surface from the upper surface.

For example, the blackened layer 120 and the metal layer 110 may be patterned to have a reverse taper shape. In this case, the antenna unit 220 may not be uniformly buried in the passivation layer 210 due to the taper angle. Accordingly, structural stability of the antenna device 200 may be deteriorated and defects may be remarkably increased.

Figure 4C:
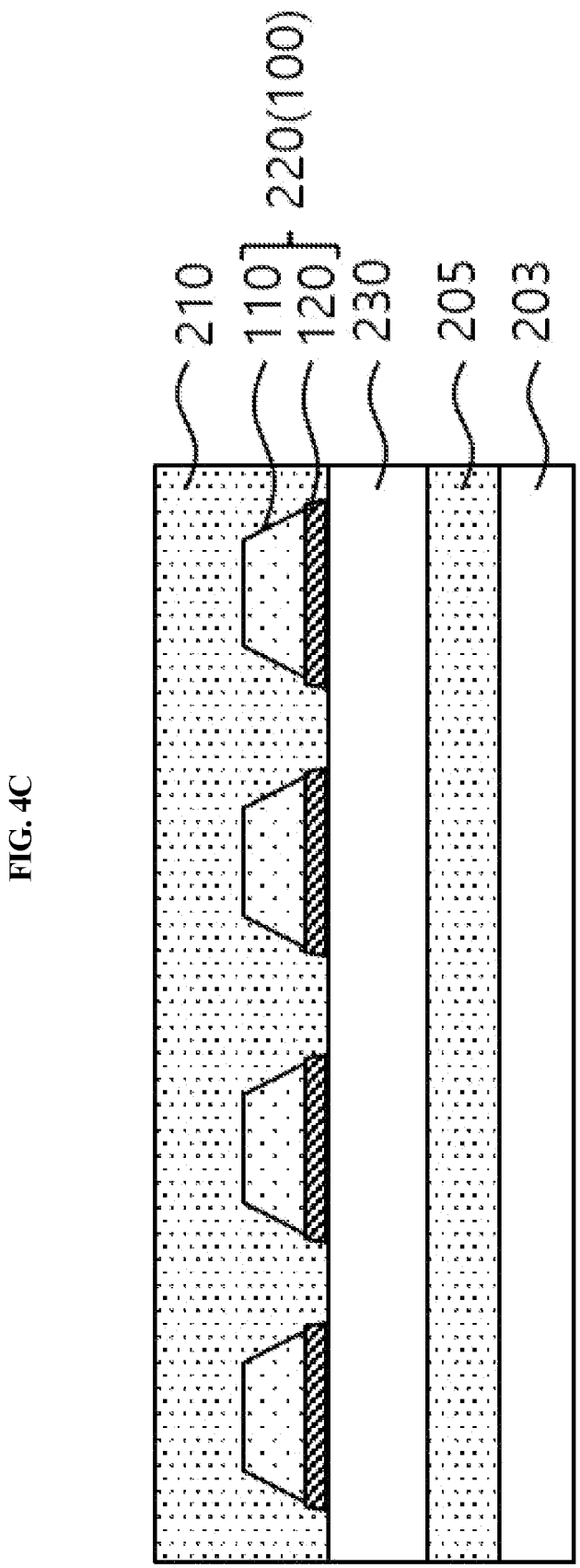

However, referring to FIG. 4C section, in the method of manufacturing the antenna device 200 according to exemplary embodiments of the present invention, after forming the antenna unit 220 to have a regular taper shape, the passivation layer 210 may be formed on the first insulation layer 230 so that the antenna unit 220 is at least partially buried therein. In this case, the antenna unit 220 may be uniformly buried in the passivation layer 210 in a regular taper shape, thereby preventing an occurrence of defects in the antenna device 200.

Figure 4D:
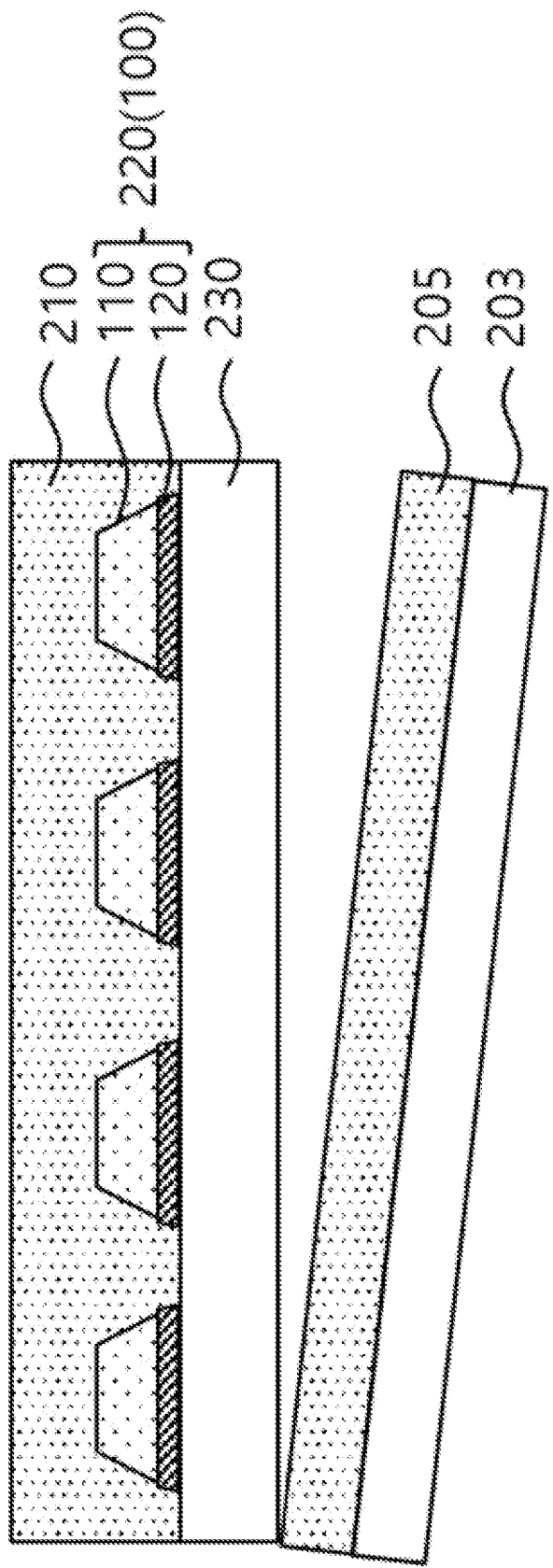

Referring to FIG. 4D section, a laminate including the first insulation layer 230, the antenna unit 220 and the passivation layer 210 may be separated from the carrier substrate 203 or the separation layer 205.

In one embodiment, after forming the passivation layer 210, the carrier substrate 203 and the separation layer 205 may be separated from the first insulation layer 230.

In one embodiment, after forming the passivation layer 210, the carrier substrate 203 may be peeled-off from the separation layer 205. In this case, the laminate may further include the separation layer 205.

Referring to FIG. 4E section, the separated laminate may be turned upside down and laminated on the second insulation layer 240 (in a transfer process).

For example, the laminate may be laminated on the second insulation layer 240 to bring the surface of the passivation layer 210 into contact with the upper surface of the second insulation layer 240.

In this case, the conductive pattern 100 formed in a normal taper shape may be converted into a reverse taper shape. Accordingly, it is possible to provide the antenna device 200 with remarkably reduced visibility of the antenna unit 220 while having improved reliability.

The second insulation layer 240 may include, for example, the above-described organic and/or inorganic insulation materials.

In some embodiments, the passivation layer 210 may be formed so as to cover the radiator 222 of the antenna unit 220 with the signal pad 226 being at least partially exposed.

In some embodiments, the inventive method may further include the step of electrically connecting the circuit board 250 to the signal pad 226 before the transfer process. In this case, the circuit board 250 may be stably disposed between the antenna unit 220 and the second insulation layer 240. Accordingly, structural stability of the antenna device 200 may be improved.

Figure 5:
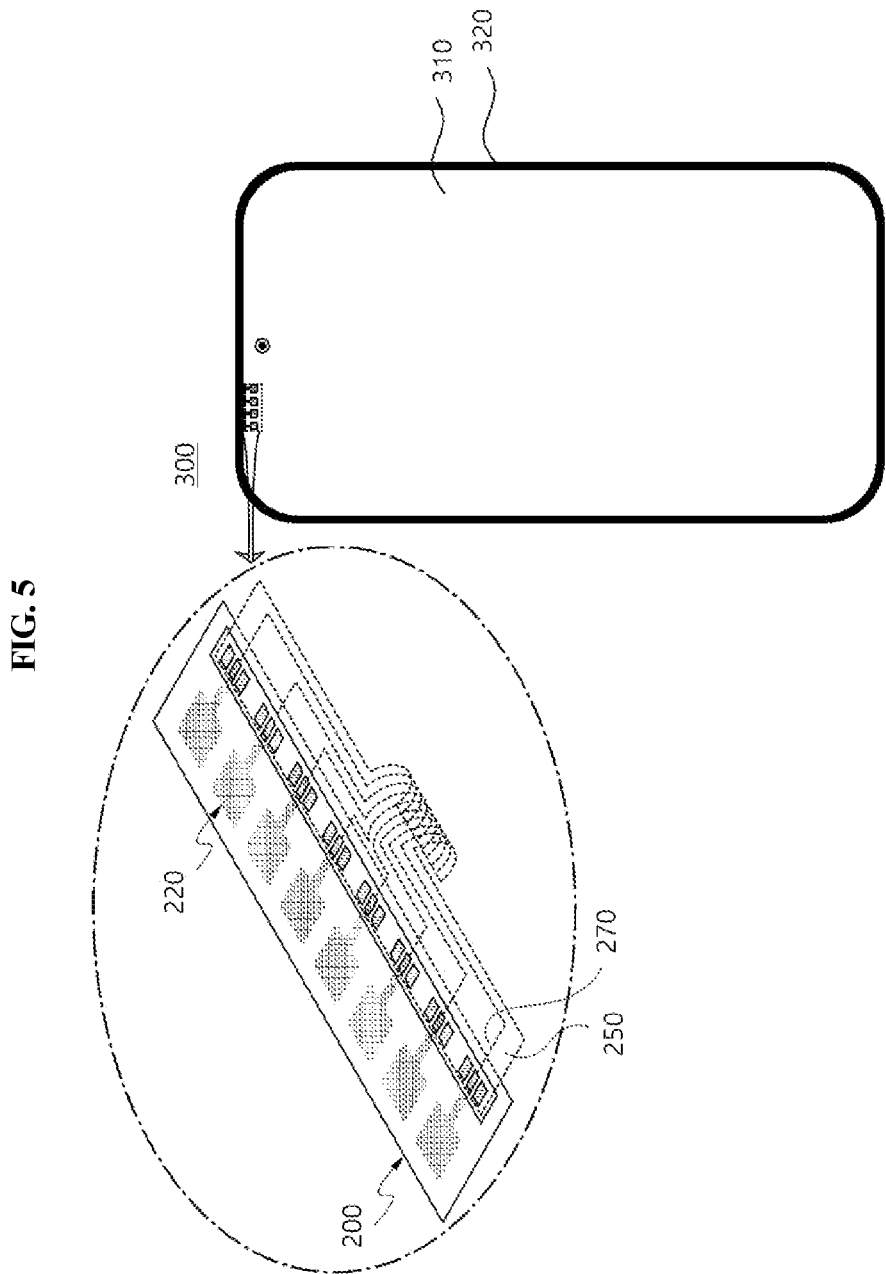
FIGS. 5 and 6 are a schematic plan view and a cross-sectional view for description an image display device according to exemplary embodiments, respectively.
Figure 6:
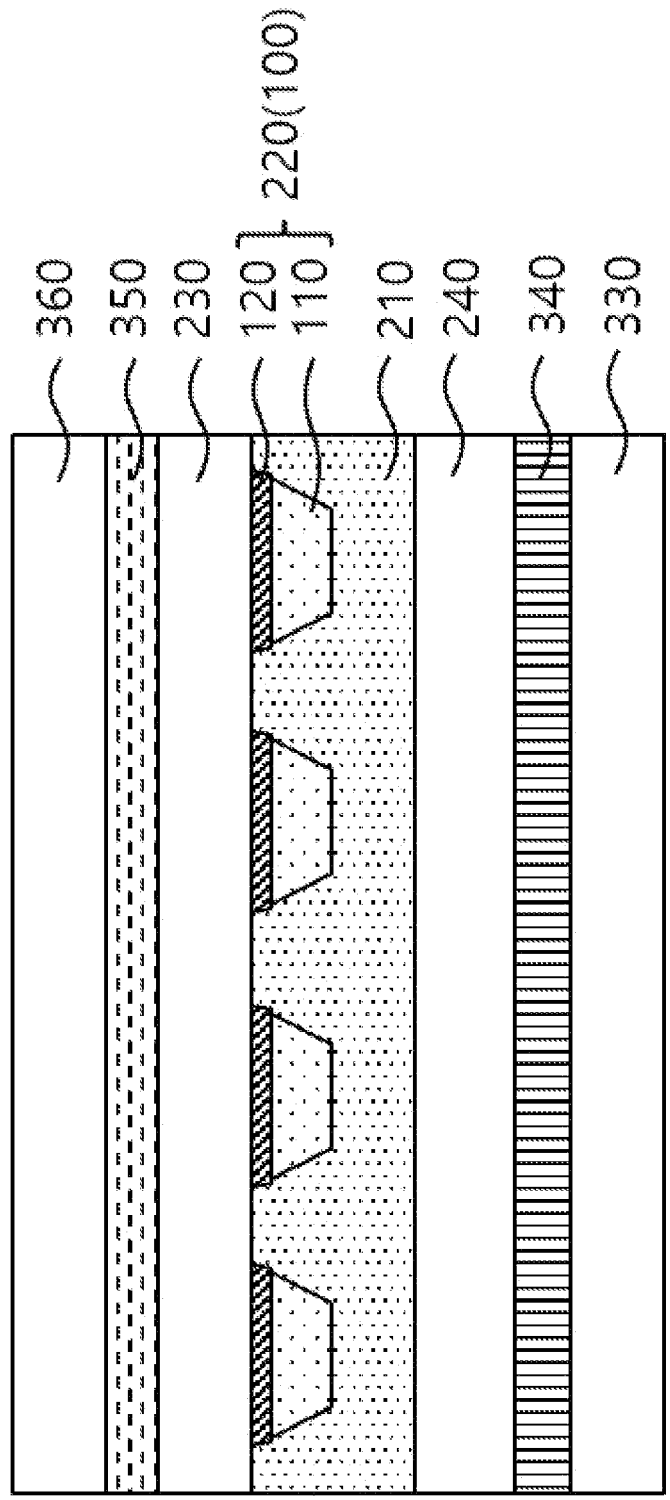

FIGS. 5 and 6 are a schematic plan view and a cross-sectional view for description an image display device according to exemplary embodiments, respectively.

Referring to FIG. 5, an image display device 300 may be implemented in a form of, for example, a smart phone. FIG. 5 shows a front portion or window surface of the image display device 300. The front portion of the image display device 300 may include a display region 310 and a peripheral region 320. The peripheral region 320 may correspond to, for example, a light-shielding part or a bezel part of the image display device.

The above-described antenna device 200 may be disposed toward the front portion of the image display device 300, and for example, may be disposed on the upper surface of the display panel 330.

In some embodiments, the radiator 222 may be at least partially overlapped with the display region 310. In this case, at least a portion of the radiator 222 and the transmission line 224 may include a mesh-pattern structure, and a decrease in the transmittance due to the radiator 222 and the transmission line 224 may be prevented. The signal pad 226 and the ground pad 228 included in the antenna unit 220 may be formed in a solid metal pattern and disposed in the peripheral region 320.

In some embodiments, the circuit board 250 may be bent and positioned on a rear surface of the image display device 300 and may extend toward the main board on which the antenna driving IC chip is mounted. Accordingly, power supply to the antenna unit 220 and antenna driving control may be implemented through the antenna driving IC chip.

Referring to FIG. 6, the image display device 300 may include a display panel 330 and an optical layer 340 disposed on the display panel 330.

The optical layer 340 may be, for example, a polarization layer including a coating type polarizer or polarizing plate. The coating type polarizer may include a liquid crystal coating layer including a polymerizable liquid crystal compound and a dichroic dye. In this case, the optical layer 340 may further include an alignment layer for imparting alignment to the liquid crystal coating layer.

For example, the polarizing plate may include a polyvinyl alcohol polarizer and a protective film attached to at least one surface of the polyvinyl alcohol polarizer.

For example, the optical layer 340 may be disposed between the antenna unit 220 and the display panel 330. In this case, the antenna unit 220 may be closer to the visible side of the user than the optical layer 340. Accordingly, the above-described reduction in the visibility of the conductive pattern 100 and the antenna unit 220 may be practically applied.

In some embodiments, a cover window 360 may be laminated on the first insulation layer 230. The cover window 360 may be laminated with the first insulation layer 230 through an adhesive layer 350, for example.

For example, the cover window 360 may be provided as a window cover, cover glass, protective cover film, or protective cover layer of the image display device 300. In this case, the cover window 360 may be provided as a visible surface of the user or an outermost surface of the image display device 300.

The cover window 360 may include, for example, glass or a flexible resin material such as polyimide, polyethylene terephthalate, acrylic resin, or siloxane resin, etc.

For example, the adhesive layer 350 may include a pressure sensitive adhesive (PSA) or an optically clear adhesive (OCA) including, for example, an acrylic resin, a silicone resin, or an epoxy resin, etc.

As described above, it is possible to suppress the antenna device 200 from being viewed by a user and improve image quality of the image display device 300 by using the conductive pattern 100 having the reverse taper shape.

What is claimed is:

1. A conductive pattern comprising:
   a metal pattern having an upper surface and a lower surface; and
   a blackened pattern covering the upper surface of the metal pattern, the blackened pattern having an upper surface and a lower surface,
   wherein at least one of the metal pattern and the blackened pattern has a reverse taper shape, and
   the upper surface of the blackened pattern is formed to face a direction opposite to the lower surface of the metal pattern.

2. The conductive pattern according to claim 1, wherein a ratio of an area of the blackened pattern to an area of the metal pattern at a contact surface between the metal pattern and the blackened pattern is 100% to 160%.

3. The conductive pattern according to claim 1, wherein upper and side surfaces of the metal pattern form a first reverse taper angle, and upper and side surfaces of the blackened pattern form a second reverse taper angle; and
   each of the first reverse taper angle and the second reverse taper angle is 40 to 90°.

4. The conductive pattern according to claim 1, further comprising a transparent conductive oxide pattern disposed on a lower surface of the metal pattern.

5. The conductive pattern according to claim 1, wherein the blackened pattern has a thickness of 60 to 120 nm.

6. An antenna device comprising:
   a passivation layer;
   an antenna unit which is at least partially buried in an upper portion of the passivation layer, the antenna unit comprising the conductive pattern of claim 1; and
   a first insulation layer laminated on an upper surface of the passivation layer, the first insulation layer covering the antenna unit.

7. The antenna device according to claim 6, wherein the antenna unit is spaced apart from a lower surface of the passivation layer in a thickness direction.

8. The antenna device according to claim 6, wherein the upper surface of the passivation layer and an upper surface of the antenna unit are disposed on the same plane.

9. The antenna device according to claim 6, wherein the antenna unit comprises a radiator, a transmission line extending from the radiator, and a signal pad connected to a distal end of the transmission line, and
   the radiator comprises the conductive pattern.

10. The antenna device according to claim 9, wherein the transmission line and the signal pad comprise the conductive pattern.

11. An image display device comprising:
    a display panel; and
    the antenna device of claim 6 disposed on the display panel,
    wherein the upper surface of the blackened pattern is configured to be a visible surface, and the lower surface of the metal pattern is configured to be a device surface opposite to the visible surface.

12. The image display device according to claim 11, wherein the image display device is laminated on the display panel so that a lower surface of the passivation layer faces the display panel.

13. The image display device according to claim 11, further comprising an optical layer disposed between the antenna device and the display panel.

14. A method of manufacturing an antenna device, comprising:
    sequentially forming a separation layer, a first insulation layer, a blackened layer and a metal layer on a carrier substrate;
    patterning the blackened layer and the metal layer to form an antenna unit which comprises a conductive pattern comprising the blackened pattern and the metal pattern;
    forming a passivation layer on the first insulation layer so that the antenna unit is at least partially buried therein; and
    laminating a laminate comprising the first insulation layer, the antenna unit and the passivation layer on a second insulation layer to bring a surface of the passivation layer into contact with an upper surface of the second insulation layer.

15. The method of manufacturing an antenna device according to claim 14, wherein the passivation layer, the metal pattern and the blackened pattern are sequentially disposed from the upper surface of the second insulation layer, and
    at least one of the blackened pattern and the metal pattern has a reverse taper shape.

16. The method of manufacturing an antenna device according to claim 14, further comprising peeling off the carrier substrate and the separation layer from the first insulation layer after the forming the passivation layer.

17. The method of manufacturing an antenna device according to claim 14, further comprising peeling off the carrier substrate from the separation layer after the forming the passivation layer,
    wherein the laminate further comprises the separation layer.

18. The method of manufacturing an antenna device according to claim 14, wherein the antenna unit comprises a radiator, a transmission line extending from the radiator, and a signal pad connected to a distal end of the transmission line, and
    the passivation layer is formed to cover the radiator and at least partially expose the signal pad.

19. The method of manufacturing an antenna device according to claim 18, further comprising electrically connecting a circuit board to the signal pad before the laminating the laminate on the second insulation layer.

* * * * *